ial element
United States Patent [19]

Nagashima et al.

[11] 4,337,453

[45] Jun. 29, 1982

[54] FUNDAMENTAL ELECTRICAL ELEMENT ARRAY

[75] Inventors: Kazuyoshi Nagashima, Nirasaki; Nobuyuki Furuya, Kohfu, both of Japan

[73] Assignee: Fuji Sangyo Kabushiki Kaisha, Yamanashi, Japan

[21] Appl. No.: 127,503

[22] Filed: Mar. 5, 1980

[30] Foreign Application Priority Data

| Mar. 8, 1979 [JP] | Japan | 54-27016 |
| Mar. 8, 1979 [JP] | Japan | 54-27017 |
| Mar. 8, 1979 [JP] | Japan | 54-27018 |
| Mar. 8, 1979 [JP] | Japan | 54-27019 |
| Aug. 31, 1979 [JP] | Japan | 54-111333 |
| Aug. 31, 1979 [JP] | Japan | 54-111334 |

[51] Int. Cl.$^3$ .............................................. H01C 1/01
[52] U.S. Cl. ..................................... 338/320; 338/260; 338/275; 338/319
[58] Field of Search ............... 338/320, 319, 318, 260, 338/239, 275, 295, 334, 49; 361/417, 418, 420; 29/832, 836, 837, 841, 854, 855

[56] References Cited

U.S. PATENT DOCUMENTS

| 2,444,037 | 6/1948 | Fritschi | 338/319 X |
| 2,879,363 | 3/1959 | Mucher | 338/320 X |
| 3,259,804 | 7/1966 | Parstorfer | 29/837 |
| 3,558,994 | 1/1971 | Bernstein | 361/417 |

OTHER PUBLICATIONS

R. J. Straub et al., *IBM Technical Disclosure Bulletin*, "Component Strip Cutter", vol. 7, No. 1, pp. 87, 88, Jun. 1964.

*Primary Examiner*—C. L. Albritton
*Attorney, Agent, or Firm*—Gerald J. Ferguson, Jr.; Joseph J. Baker

[57] ABSTRACT

A first fundamental electrical element array which has a plurality of columnar, fundamental electrical elements with opposite wire leads, and in which the fundamental electrical elements are electrically and mechanically connected at one wire lead to a conductive bar at predetermined intervals so that they lie side by side in a common plane, and in which the other wire leads of the fundamental electrical elements serve as terminals for connection with a printed-circuit board. A second fundamental electrical element array which has a plurality of columnar, fundamental electrical elements with opposite wire leads and at least one lead wire, and in which the fundamental electrical elements are electrically and mechanically connected at one wire lead to a conductive bar at predetermined intervals together with the lead wire so that they lie side by side in a common plane, and in which the other wire leads of the fundamental electrical elements serve as terminals for connection with a printed-circuit board. A third fundamental electrical element array which has a plurality of columnar, fundamental electrical elements with opposite wire leads and at least one columnar, short-circuiting means with opposite wire leads, and in which the fundamental electrical elements and the short-circuiting means are electrically and mechanically connected at one wire lead to a conductive bar at predetermined intervals so that they lie side by side in a common plane, and in which the other wire leads of the fundamental electrical elements serve as terminals for connection with a printed-circuit board.

A plurality of such first fundamental electrical element arrays are mechanically coupled together so that they are aligned side by side in a common plane.

At least one such first fundamental electrical element array and at least one such second or third fundamental electrical array are mechanically coupled together so that they are aligned side by side in a common plane.

9 Claims, 18 Drawing Figures

FUNDAMENTAL ELECTRICAL ELEMENT ARRAY

BACKGROUND OF THE INVENTION

1. Field of the Invention

This invention relates to a fundamental electrical element array composed of a plurality of fundamental electrical elements such as resistance elements, capacitance elements, diode elements and so forth, or an assembly composed of a plurality of such arrays, and more particularly to a fundamental electrical element array or an assembly of such arrays to form desired electric circuits on a printed-circuit board.

2. Description of the Prior Art

As a fundamental electrical element to form desired electric circuits on a printed-circuit board, there has been employed a plurality of columnar, fundamental electrical elements each of which has opposite wire leads extending from its both ends coaxially therewith.

In general, a plurality of such fundamental electrical elements with wire leads are mounted on a printed-circuit board to form thereon desired electric circuits including the fundamental electric elements.

In the case where the fundamental electrical elements are intended so that they are electrically connected together at one wire lead on a printed-circuit boards, if they are electrically interconnected at one wire lead before-hand, then it would become unnecessary to provide a printed wire on the printed-circuit board for such electrical connections; consequently, the printed-circuit board can be simplified in construction and reduced in size by that. Further, in the case where the fundamental electrical elements are intended for such a use that they are electrically connected via one wire lead to a common predetermined printed wire on the printed-circuit board, if they are connected with a common lead wire in advance, then there is no need of providing a printed wire on the printed-circuit board for electrically interconnecting the wire leads. This also permits simplification of the printed-circuit board structure and reduction of its size.

Moreover, if the plurality of fundamental electrical elements are mechanically assembled together, they can be mounted on the printed-circuit board simultaneously. This reduces the time for mounting such fundamental electrical elements on the printed-circuit board.

In the case mentioned just above, if the fundamental electrical elements are mounted on the printed circuit board to stand upright without bending their leads, the area of the printed-circuit board occupied by the fundamental electrical elements is far smaller than in the case where such elements lie flat with their wire leads bent. Accordingly, the printed-circuit board structure can be simplified and no-process is needed for bending the wire leads of the fundamental electrical elements.

In the case where the plurality of fundamental electrical elements are electrically interconnected or connected at one end to a commmon lead wire and the elements are mechanically assembled together, as described above, if the other leads are aligned side by side in a common plane at predetermined intervals, with their free end faces lying in a common plane (in which the free end face of the common lead wire lies when the electrical elements are connected thereto), the fundamental electrical elements can easily be mounted upright in side-by-side relation on the printed-circuit board without bending their non-connected wire leads (also without bending the common lead wire when the electrical elements are connected thereto).

In the case where the plurality of fundamental electrical elements are electrically interconnected or connected at one wire lead to the commmon lead wire beforehand, as described above, it would be very advantageous if it could easily be learned, before or after mounting the elements on the printed-circuit board, what kinds of elements they are, what characteristics they have and whether the elements are electrically interconnected or connected at one wire lead to the common lead wire.

SUMMARY OF THE INVENTION

Accordingly, it is an object of this invention to provide a novel fundamental electrical element array for use with a printed-circuit board which comprises a plurality of columnar, fundamental electrical elements, each having opposite wire leads extending from its both ends concentrically therewith, and which when mounted on the printed-circuit board, establishes required electric circuits with the fundamental electrical elements electrically connected together at one wire lead thereof.

Another object of this invention is to provide a novel fundamental electrical element array for a printed-circuit board which comprises a plurality of columnar, fundamental electrical elements, each having opposite wire leads extending from its both ends concentrically therewith, and at least one lead wire having electrically connected therewith the fundamental electrical elements, and which when mounted on the printed-circuit board, sets up required electrical circuits with the electrical elements electrically connected at one wire lead with a common printed wire on the printed-circuit board.

Yet another object of this invention is to provide a novel fundamental electrical element array assembly for use with a printed-circuit board which comprises at least a fundamental electrical element array composed of a plurality of columnar, fundamental electrical elements, each having opposite wire leads extending from its both ends concentrically therewith and another fundamental electrical element array composed of a plurality of columnar, electrical elements, each having opposite wire leads extending from its both ends concentrally therewith, or another fundamental electrical element array composed of such columnar fundamental electrical elements and at least one lead wire electrically connected with the electrical elements at one wire lead thereof, and which when mounted on the printed-circuit board, sets up required electric circuits including such fundamental electrical element arrays.

DESCRIPTION OF THE PREFERRED EMBODIMENTS

Figure 1:
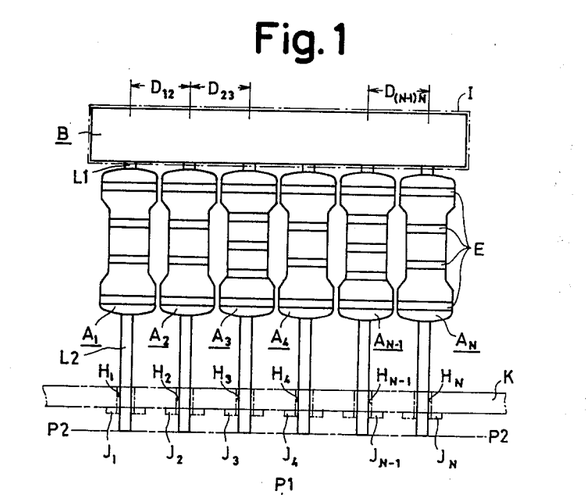
FIG. 1 is a front view of a first embodiment of a fundamental electrical element array according to this invention.
Figure 2:
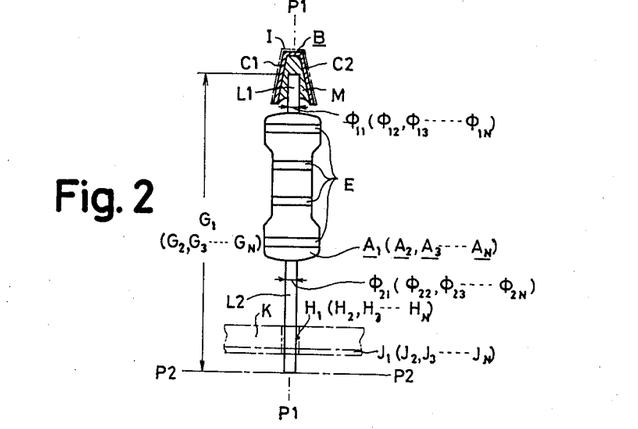
FIG. 2 is a side view, partly in section, of the first embodiment shown in FIG. 1.

FIGS. 1 and 2 illustrates a first general embodiment of the fundamental electrical element array produced according to the present invention. The fundamental electrical element array which is provided with N, especially three or more columnar, fundamental electrical elements $A_1$ to $A_N$ such as known resistance elements, capacitance elements, inductance elements, diode elements and so forth, each having wire leads L1 and L2 extending from its both ends concentrically therewith, and a conductive bar B common to the electrical elements $A_1$ to $A_N$. In this case, the lengths $G_1$ to $G_N$ of the fundamental electrical elements $A_1$ to $A_N$ between the free ends of their wire leads L1 and L2 are equal, and the diameters $\Phi_{11}$ to $\Phi_{1N}$ of the wire leads L1 are equal, and further, the diameters $\Phi_{21}$ to $\Phi_{2N}$ of the wire leads L2 are also equal. (It is preferred that the wire leads L1 and L2 are of the same diameter.) The fundamental electrical element $A_i$ (i=1, 2, ... N) is coated over its outer surface with an insulating material and has indication E which shows the kind of the element itself, for example, a resistance element, a capacitance element, an inductance element or a diode element, and/or its characteristic (for example, in the form of a resistance value in the case of the resistance element, a capacitance value in the case of the capacitance element, an inductance value in the case of the inductance element and a rise-up voltage in terms of voltage-current characteristic in the case of the diode element). In the drawings the indication E is shown to be what is called a color code indicating that the fundamental electrical element $A_i$ is a resistance element. The conductive bar B has a pair of opposing plate members C1 and C2, as viewed in section, and has an inverted V-shaped cross-section as a whole, as depicted in FIG. 2.

The free ends of the wire leads L1 of the fundamental electrical elements $A_1$ to $A_N$ extend the same length between the opposing plate members C1 and C2 of the conductive bar B and are soldered thereto as indicated by M. That is, the wire leads L1 of the fundamental electrical elements $A_1$ to $A_N$ are electrically and mechanically coupled with the conductive bar B at predetermined intervals $D_{12}$ to $D_{(N-1)N}$ (where it is preferred that $D_{12}=D_{23}=\ldots D_{(N-1)N}$) in the lengthwise direction of the conductive bar B. As a consequence, the fundamental electrical elements $A_1$ to $A_N$ are aligned in a common plane P1 at the intervals $D_{12}$ to $D_{(N-1)N}$, and the free end faces of the other leads L2 are aligned in a common plane P2. In this case, the intervals $D_{12}$ to $D_{(N-1)N}$ are selected so that the fundamental electrical elements $A_1$ to $A_N$ are in contact with or a little spaced from adjacent ones of them. The conductive bar B is covered with an insulating tape or like material layer I, as indicated by the chain line.

The above is the first embodiment of the present invention. The fundamental electrical element array described above is used with a printed-circuit board in the following manner: If the printed-circuit board has formed therein wire lead insertion holes $H_1$ to $H_N$ respectively corresponding to the wire leads L2 of the fundamental electrical elements $A_1$ to $A_N$ and has formed on one surface thereof printed wires $J_1$ to $J_N$ respectively formed around the abovesaid holes $H_1$ to $H_N$, as indicated by the chain lines and K, the free ends of the leads L2 of the elements $A_1$ to $A_N$ are inserted into the holes $H_1$ to $H_N$ of the printed circuit board K and then electrically and mechanically connected, by soldering, to the printed leads $J_1$ to $J_N$ of the printed-circuit board K.

When the fundamental electrical element array of the above first embodiment has thus been mounted on the printed-circuit board K, intended electric circuits are established on the printed-circuit board including the individual fundamental electrical elements. In this first embodiment, as shown in FIG. 3, the wire leads L1 of the fundamental electrical elements $A_1$ to $A_N$ are electrically interconnected via the conductive bar B, and the other wire leads L2 serve as terminals $T_1$ to $T_N$.

Figure 3:
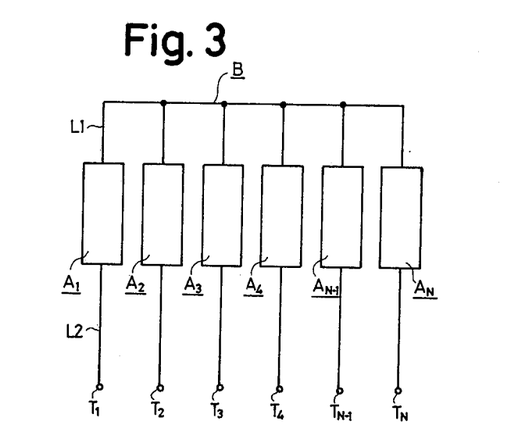
FIG. 3 is an equivalent circuit diagram of the first embodiment of FIG. 1.

According to the first embodiment, since the fundamental electrical element array has such an arrangement as shown in FIG. 3, there is no need of providing a printed wire on the printed-circuit board for electrically interconnecting thereon the wire leads L1 of the elements $A_1$ to $A_N$ when setting up the aforesaid required electric circuits; therefore, the printed-circuit board can be simplified in construction and reduced in size.

Further, in the first embodiment described above, the fundamental electrical elements $A_1$ to $A_N$ are mechanically assembled together by the conductive bar B and hence can be installed all together on the printed-circuit board in a short time; furthermore, there is not involved a process of bending the wire leads of the elements $A_1$ to $A_N$.

Moreover, in accordance with the above first embodiment, since the fundamental electrical elements $A_1$ to $A_N$ stand upright and are aligned side by side when mounted on the printed-circuit board as described above, the printed-circuit board structure can be reduced. Further, since the indication E of the element $A_i$ can easily be seen from the outside, the kind and/or characteristic of the element can be learned before and after it is installed on the printed-circuit board.

Figure 4:
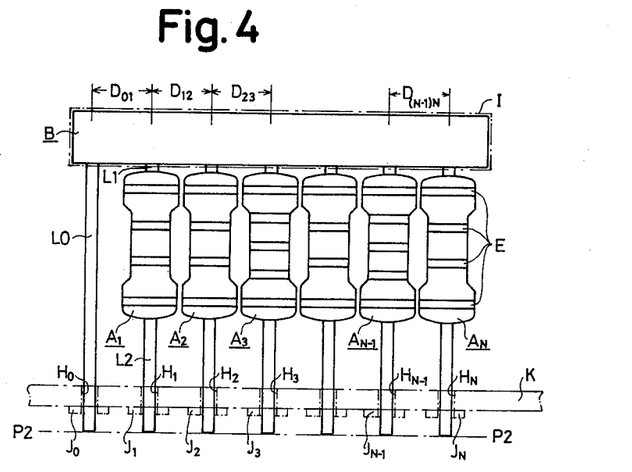
FIG. 4 illustrates a second embodiment of this invention.

FIG. 4 illustrates a second embodiment of the fundamental electrical element array of the present invention. In FIG. 4, parts corresponding to those in FIG. 1 are identified by the same reference characters and no detailed description thereof will be repeated.

The second embodiment of FIG. 4 has such a construction that, for example, one lead wire L0 is added to the arrangement of the first embodiment described previously in respect of FIG. 1. The lead wire L0 has the same length as those $G_i$ of the fundamental electrical elements $A_i$ and has the same diameter as those of the wire leads L1 and L2 of the elements $A_i$. One end of the lead wire L0 is disposed between the opposing plate members C1 and C2 of the conductive bar B and is electrically and mechanically coupled therewith by solder M, as is the case with the free ends of the wire leads L1 of the elements $A_1$ to $A_N$, and the lead wire is positioned in the plane P1 in alignment with the elements $A_1$ to $A_N$. The free end face of the lead wire L0 lies in the plane P2 in which the free end faces of the wire leads L2 of the elements $A_1$ to $A_N$ lie. The lead wire L0 is disposed on the opposite side from the element $A_2$ with respect to the element $A_1$ and spaced therefrom a distance $D_{01}$, which is selected smaller than those $D_{12}$ to $D_{(N-1)N}$.

The above is the second embodiment of the fundamental electrical element array of this invention. According to this embodiment, the fundamental electrical element array can be installed on the printed-circuit board K in the same manner as in the case of the first embodiment. In this case, the printed-circuit board K is provided with a hole $H_0$ for receiving the free end of the lead wire L0, in addition to the holes $H_1$ to $H_N$ for receiving the wire leads L2 of the elements $A_1$ to $A_N$, and a printed wire $J_0$ formed around the hole $H_0$. The free end of the lead wire L0 is inserted into the hole $H_0$ concurrently with the insertion of the free ends of the wire leads L2 of the elements $A_1$ to $A_N$ into the holes $H_1$ to $H_N$ and is electrically and mechanically coupled with the printed wire $J_0$ by means of soldering at the same as the free ends of the wire lead L2 are electrically and mechanically connected, by soldering, to the printed wire $J_1$ to $J_N$ respectively.

Figure 5:
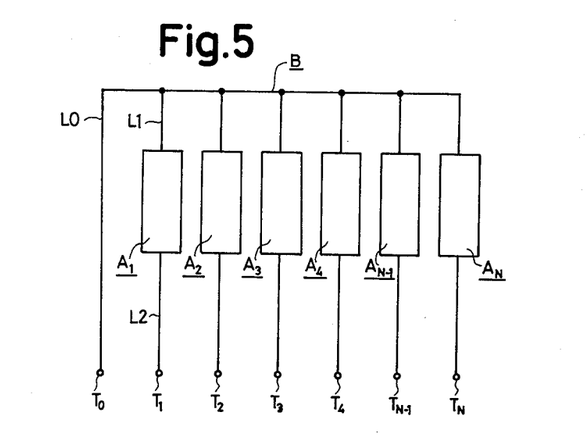
FIG. 5 is an equivalent circuit diagram of the second embodiment of FIG. 4.

When the fundamental electrical element array of the above second embodiment has thus been mounted on the printed-circuit board, intended electric circuits are established on the printed-circuit board including the fundamental electrical elements. In this second embodiment, as shown in FIG. 5, the wire leads L1 of the fundamental electrical elements $A_1$ to $A_N$ are electrically interconnected via the conductive bar B and led out to the lead wire L0, and the other wire leads L2 serve as terminals $T_1$ to $T_N$, and the lead wire L0 serves as a terminal T0 common to the wire leads L1 of the elements $A_1$ to $A_N$.

Further, though not described in detail, the second embodiment described above also exhibits the same advantages as those referred to in connection with the first embodiment.

Figure 6:
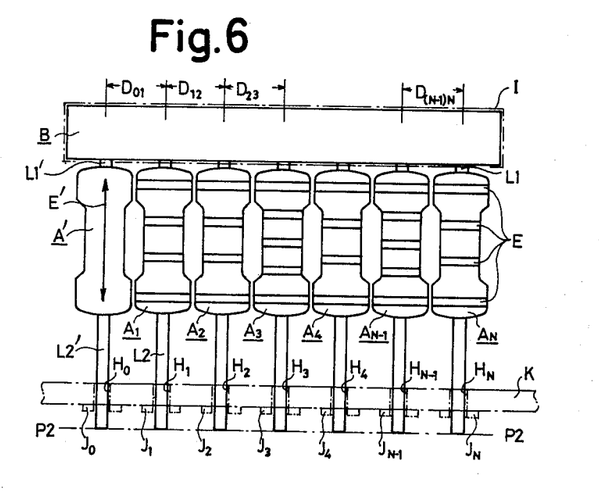
FIG. 6 shows a third embodiment of this invention.

FIG. 6 illustrates a third embodiment of the fundamental electrical element array of the present invention. In FIG. 6, parts corresponding to those in FIG. 1 are marked with the same reference characters and no detailed description thereof will be repeated.

The third embodiment shown in FIG. 6 has such a construction that, for example, one columnar, short-circuiting element A' provided with wire leads L1' and L2' extending from its both ends concentrically therewith is added to the arrangement of the first embodiment of FIG. 1.

The short-circuiting element A' presents the same external appearance as the fundamental electrical element $A_i$, and its length between the free ends of the wire leads L1' and L2' is equal to the aforesaid length $G_i$ of the element $A_i$, and the diameters of the wire leads L1' and L2' are equal to the diameters $\Phi_{11}$ and $\Phi_{21}$ of the wire leads L1 and L2 of the element $A_i$. The short-circuiting element A' has the same construction as the element $A_i$ except in that the resistor of the element $A_i$ is substituted with a conductor. It is preferred that the short-circuiting element A' has its outer surface coated with an insulating material and that the coated surface has provided thereon an indication E' that the element A' is a short-circuiting element. The free end of the wire lead L1' of the short-circuiting element A' is electrically and mechanically connected, by solder M, to the conductive bar B between the opposing plate members C1 and C2 thereof, as is the case with the free end of the wire lead L1 of the element $A_i$, and the short-circuiting element A' is disposed in the same plane P1 (not shown in FIG. 6) as the elements $A_1$ to $A_N$. The free end face of the other wire lead L2' of the short-circuiting element A' is aligned in the plane P2 in which the free end faces of the wire leads L2 of the elements $A_1$ to $A_N$ lie. The short-circuiting element A' is disposed on the opposite side from the element $A_2$ with respect to the element $A_1$ and spaced therefrom a distance $D_{01}$, which is selected the same as those $D_{12}$ to $D_{(N-1)N}$.

The above is the third embodiment of the present invention, which is exactly identical in construction with the aforesaid second embodiment except in that the short-circuiting element A' replaces the lead wire L0. Therefore, according to the third embodiment, though not described in detail, the fundamental electrical element array can be used with the same printed-circuit board as mentioned previously with regard to the second embodiment.

Further, when the fundamental electrical element array of the third embodiment is assembled with the printed-circuit board K, predetermined electric circuits are set up thereon including the individual elements, as is the case with the second embodiment described previously. In this case, the electric circuit formed by the third embodiment is the same as that shown in FIG. 5 which is established by the second embodiment. Moreover, the third embodiment has the same advantage as those obtainable with the second embodiment.

Figure 7:
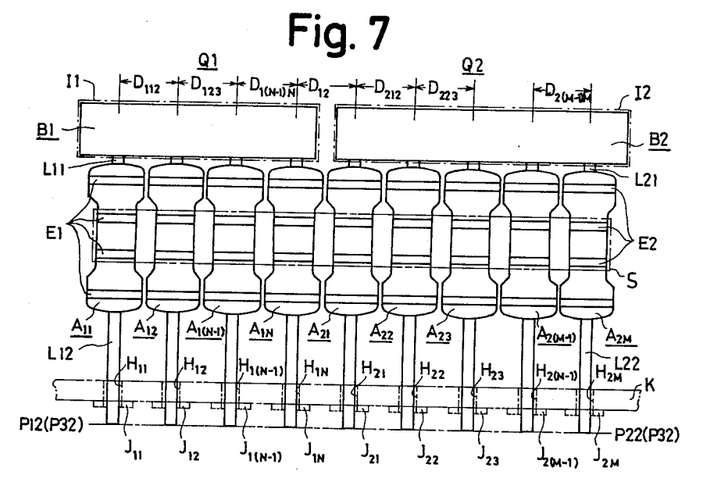
FIG. 7 shows a fourth embodiment of this invention.

FIG. 7 illustrates a fourth embodiment of the fundamental electrical element array of the present invention, which comprises plural, for example, two fundamental electrical element arrays Q1 and Q2 identical in construction with the array of the first embodiments.

As is the case with the first embodiment, the fundamental electrical element array Q1 in the fourth embodiment is composed of N fundamental electrical elements $A_{11}$ to $A_{1N}$ which are the same as those $A_i$ employed in the element array of the first embodiment. The other fundamental electrical element array Q2 is comprised of M fundamental electrical elements $A_{21}$ to $A_{2M}$ similar to those $A_i$ employed in the first embodiment.

In FIG. 7, wire leads extending from both ends of the fundamental electrical elements $A_{1i}$ and $A_{2j}$ (J=1, 2, ... . M) are respectively indicated by L11, L12 and L21, L22, and the indications showing the kind and/or characteristic of the elements $A_{1i}$ and $A_{2j}$ are designated by E1 and E2 respectively. Further, conductive bars interconnecting the wire leads L11, L12 and L21, L22 of the elements $A_{11}$ to $A_{1N}$ to $A_{21}$ to $A_{2M}$ are indicated by B1 and B2 respectively; the distances between the elements $A_{11}$ and $A_{12}$, between $A_{12}$ and $A_{13}$, ... and between $A_{1(N-1)}$ and $A_N$ are respectively indicated by $D_{112}$, $D_{123}$, ... and $D_{1(N-1)N}$, and the distances between the elements $A_{21}$ and $A_{22}$, between $A_{22}$ and $A_{23}$, ... and $A_{2(M-1)}$ and $A_{2M}$ are respectively indicated by $D_{212}$, $D_{223}$, ... and $D_{2(M-1)M}$. The elements $A_{11}$ to $A_{1N}$ and $A_{21}$ to $A_{2M}$ are respectively aligned in planes P11 and P21 which lie in a common plane P31. The planes in which the free end faces of the wire leads L11, L12 and L21, L22 of the elements $A_{11}$ to $A_{1N}$ and $A_{21}$ to $A_{2M}$ lie are respectively indicated by P12 and P22, and insulating material layers coated on the conductive bars B1 and B2 are respectively indicated by I1 and I2. These planes P12 and P22 lie in a common plane P32.

The fundamental electrical element arrays Q1 and Q2 are assembled together, with a predetermined distance $D_{12}$ held therebetween, by a resinous material S deposited over the elements $A_{11}$ to $A_{1N}$ of the element array Q1 and the elements $A_{21}$ to $A_{2M}$ of the element array Q2, as indicated by the chain line. In this case, the element arrays Q1 and Q2 are assembled together in side-by-side relation so that a plane P11 (not shown) where the elements $A_{11}$ to $A_{1N}$ of the element array Q1 lie and a plane P21 (not shown) where the elements $A_{21}$ to $A_{2M}$ of the element array Q2 lie may form a common plane P31 (not shown) and that the plane P12 where the free end faces of the wire leads L12 of the elements $A_{11}$ to $A_{1N}$ of the element array Q1 lie and the plane P22 where the free end faces of the wire leads L22 of the elements $A_{21}$ to $A_{2M}$ of the element array Q2 llie may form a common plane P32. It is preferred that the distance $D_{12}$ between the element $A_N$ of the element array Q1 and the element $A_1$ of the element array Q2 is equal to the aforesaid distance $D_{1(i-1)i}$ or $D_{2(j-1)j}$.

The above is the fourth embodiment fo the fundamental electrical element array of the present invention, which can be installed on the printed-circuit board in the following manner: If the printed-circuit board has wire lead insertion holes $H_{11}$ to $H_{1N}$ and $H_{21}$ to $H_{2M}$ respectively corresponding to the wire leads L12 of the elements $A_{11}$ to $A_{1N}$ of the element array Q1 and the wire leads L22 of the elements $A_{21}$ to $A_{2M}$ of the element array Q2 and has, on its one side, printed wires $J_{11}$ to $J_{1N}$ and $J_{21}$ to $J_{2M}$ formed around the abovementioned holes $H_{11}$ to $H_{1N}$ and $H_{21}$ to $H_{2M}$, as indicated by the chain lines, the free ends of the wire leads L12 of the elements $A_{11}$ to $A_{1N}$ of the element array Q1 and the free ends of the wire leads L22 of the elements $A_{21}$ to $A_{2M}$ of the element array Q2 are respectively inserted into the corresponding holes $H_{11}$ to $H_{1N}$ and $H_{21}$ to $H_{2M}$ of the printed-circuit board K and then electrically and mechanically coupled with the printed wires $J_{11}$ to $J_{1N}$ and $J_{21}$ to $J_{2M}$ by means of soldering, by which the fundamental electric element array assembly of the fourth embodiment can be mounted on the printed-circuit board.

Figure 8:
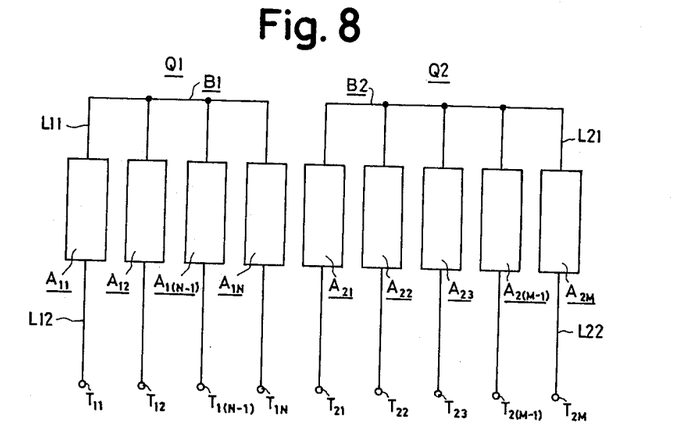
FIG. 8 is an equivalent circuit diagram of the fourth embodiment of FIG. 7.

When the fundamental electrical element array of the above fourth embodiment has thus been mounted on the printed-circuit board, predetermined electric circuits are established on the printed-circuit board including the individual fundamental electrical elements. In this fourth embodiment, as shown in FIG. 8, the wire leads L11 of the elements $A_{11}$ to $A_{1N}$ of the element array Q1 are electrically interconnected via the conductive bar B1, and the other wire leads L12 respectively serve as terminals $T_{11}$ to $T_{1N}$. Further, the wire leads L21 of the elements $A_{21}$ to $A_{2M}$ of the element array Q2 are electrically interconnected via the conductive bar B2, and the other wire leads L22 respectively serve as terminals $T_{21}$ to $T_{2M}$.

Further, the fundamental electric element array of the fourth embodiment described above also has excellent features obtainable with the element array of the first embodiment.

Figure 9:
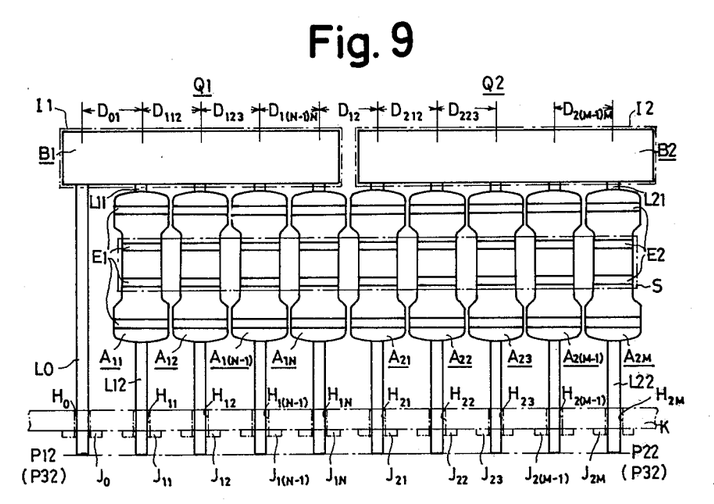
FIG. 9 shows a fifth embodiment of this invention.

FIG. 9 shows a fifth embodiment of the fundamental electrical element array of the present invention. The illustrated embodiment comprises at least one fundamental electrical element array Q2 similar to that of the first embodiment (FIGS. 1 to 3) and at least one fundamental electrical element array Q1 similar to that of the second embodiment (FIGS. 4 and 5).

The element array Q2 is identical in construction with the element array employed in the fourth embodiment described previously with respect to FIG. 7; therefore, parts corresponding to those in FIG. 7 are identified by the same reference characters and no detailed description will be repeated. The element array Q1 is composed of N fundamental electrical elements $A_{11}$ to $A_{1N}$ similar to the element $A_i$ employed in the second embodiment and one lead wire L0 similar to the lead wire L0 used in the second embodiment. In FIG. 9, wire leads extending from both ends of the element $A_{1i}$, are indicated by L11 and L12; the indication showing the kind and/or characteristic of the element $A_{1i}$ is designated by E1; the conductive bar having connected thereto the wire leads L11 of the elements $A_{11}$ to $A_{1N}$ and the lead wire L0 is indicated by B1; the distances between the elements $A_{11}$ and $A_{12}$, between $A_{12}$ and $A_{13}$, . . . and between $A_{1(N-1)}$ and $A_N$ are indicated by $D_{112}$, $D_{123}$, . . . and $D_{1(N-1)N}$; the distance between the element $A_{11}$ and the lead wire L0 is indicated by $D_{01}$; the plane in which the free end faces of the wire leads L12 of the elements $A_{11}$ to $A_{1N}$ and the lead wire L0 lie is indicated by P12; the insulating layer coated on the conductive bar B1 is indicated by I1.

The fundamental electrical element arrays Q1 and Q2 are assembled together, with a predetermined distance $D_{12}$ held therebetween, by a resinous material S desposited over the elements $A_{11}$ to $A_{1N}$ of the element array Q1 and the elements $A_{21}$ to $A_{2M}$ of the element array Q2, as indicated by the chain line. In this case, the element arrays Q1 and Q2 are assembled together to bear such a side-by-side relation that a plane P11 (not shown) where the elements $A_{11}$ to $A_{1N}$ and the lead wire L0 of the element array Q1 lie and a plane P21 (not shown) where the elements $A_{21}$ to $A_{2M}$ of the element array Q2 lie may form a common plane P31 and that the plane P12 where the free end faces of the wire leads L12 of the elements $A_{11}$ to $A_{1N}$ and the lead wire L0 of the element array Q1 lie and the plane P22 where the free end faces of the wire leads L22 of the elements $A_{21}$ to $A_{2M}$ of the element array Q2 lie may form a common plane P32. It is preferred that the distance $D_{12}$ between the element $A_N$ of the element array Q1 and the element $A_1$ of the element array Q2 is equal to the aforesaid distance $D_{1(i-1)i}$ or $D_{2(j-1)j}$.

The above is the fifth embodiment of the fundamental electrical element array of the present invention, which can be installed on the printed-circuit board K in the same manner as in the fourth embodiment, as indicated by the chain lines. In this case, however, the printed-circuit board K has a hole H0 for receiving the lead wire L0 and a printed wire J0 formed around the hole H0.

Figure 10:
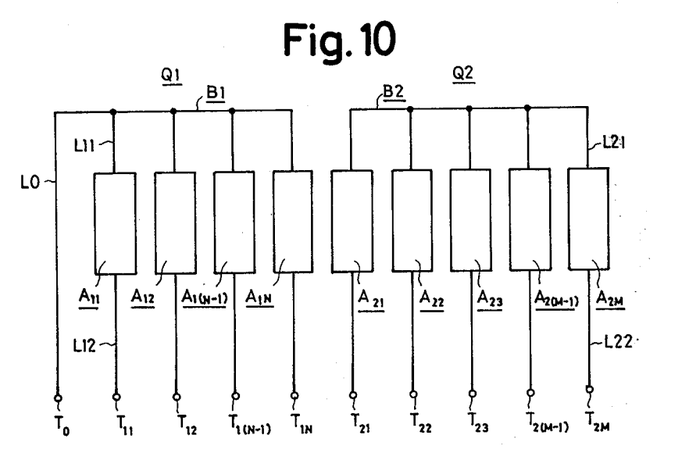
FIG. 10 is an equivalent circuit diagram of the fifth embodiment of FIG. 9.

When the fundamental electrical element array of the fifth embodiment is mounted on the printed-circuit board, there are established required electric circuits including the individual elements. In this case, the element array of the fifth embodiment is identical in construction with the element array of the fourth embodiment except in that the elements $A_{11}$ to $A_{1N}$ of the element array Q1 are electrically connected with the lead wire L0 and in that the lead wire L0 serves as a terminal T0 common to the wire leads L11 of the elements $A_{11}$ to $A_{1N}$, as depicted in FIG. 10.

Further, though not described in detail, the element array of the fifth embodiment has the same features as those described above in connection with the first, second and fourth embodiments shown in FIGS. 1, 2 and 7 respectively.

Figure 11:
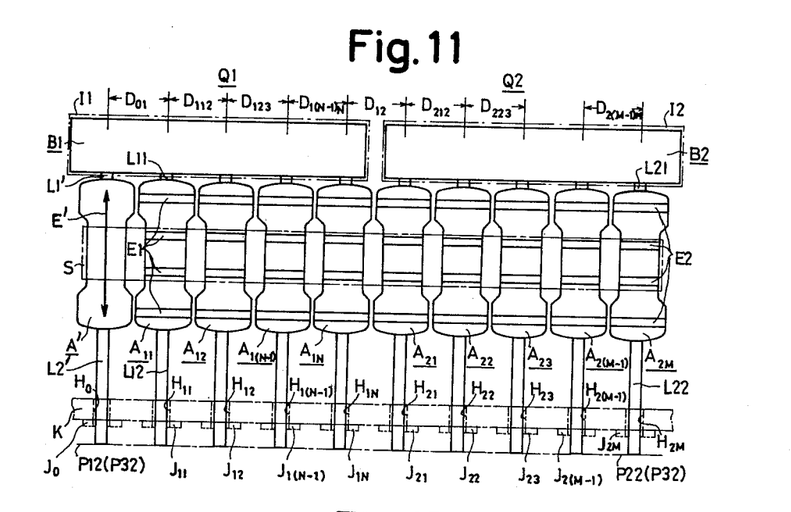
FIG. 11 illustrates a sixth embodiment of this invention.

FIG. 11 shows a sixth embodiment of the fundamental electrical element array of the present invention. The illustrated embodiment comprises at least one fundamental electrical element array Q2 similar to that of the first embodiment (FIGS. 1 to 3) and at least one fundamental electrical element array Q1 similar to that of the third embodiment (FIG. 6).

The element array Q2 is identical in construction with the element array employed in the fourth embodiment described previously with respect to FIG. 7; therefore, parts corresponding to those in FIG. 7 are identified by the same reference characters and no detailed description will be repeated. The element array Q1 is composed of N fundamental electrical elements $A_{11}$ to $A_{1N}$ similar to the element $A_i$ employed in the third embodiment and one short-circuiting element A' similar to the short-circuiting element A' used in the third embodiment. In FIG. 11, wire leads extending from both ends of the element $A_{1i}$ are indicated by L11 and L12; the indication showing the kind and/or characteristic of the element $A_{1i}$ is designated by E1; the conductive bar having connected thereto the wire leads L11 of the elements $A_{11}$ to $A_{1N}$; 1 and the wire lead L1' of the short-circuiting element A' is indicated by B1; the distances between the elements A' and $A_{11}$, between $A_{11}$ and $A_{12}$, between $A_{12}$ and $A_{13}$, . . . and between $A_{1(N-1)}$ and $A_N$ are indicated by $D_{112}$, $A_{123}$, . . . and $D_{1(N-1)N}$; the plane in which the free end faces of the wire leads L12 of the elements $A_{11}$ to $A_{1N}$ and the wire lead L2' of the short-circuiting element A' lie is indicated by P12; the insulating layer coated on the conductive bar B1 is indicated by I1.

The fundamental electrical element arrays Q1 and Q2 are assembled together, with a predetermined distance $D_{12}$ held therebetween, by a resinous material S deposited over the elements $A_{11}$ to $A_{1N}$ of the element array Q1 and the elements $A_{21}$ to $A_{2M}$ and the short-circuiting element A' of the element array Q2, as indicated by the chain line. In this case, the element arrays Q1 and Q2 are assembled together to bear such a side-by-side relation that a plane P11 (not shown) where the elements $A_{11}$ to $A_{1N}$ and the short-circuiting element A' of the element array Q1 lie and a plane P21 (not shown) where the elements $A_{21}$ to $A_{2M}$ of the element array Q2 lie may form a common plane P31 (not shown) and that plane P12 where the free end faces of the wire leads L12 of the elements $A_{11}$ to $A_{1N}$ of the element array Q1 and the wire lead L2' of the short-circuiting element A' lie and the plane P22 where the free end faces of the wire leads L22 of the elements $A_{21}$ to $A_{2M}$ of the element array Q2 lie may form a common plane P32. It is preferred that the distance $D_{12}$ between the element $A_N$ of the element array Q1 and the element $A_1$ of the element array Q2 is equal to the aforesaid distance $D_{1(i-1)i}$ or $D_{2(j-1)j}$.

The above is the sixth embodiment of the fundamental electrical element array of the present invention, which can be installed on the printed-circuit board K in the same manner as in the fifth embodiment, as indicated by the chain lines, though not described in detail.

Further, since the element array of the sixth embodiment has the same electrical connections as shown in FIG. 10 that the element array of the fifth embodiment has, when the element array of the sixth embodiment is mounted on the printed-circuit board, there can be established the same electric circuits as in the case of the fifth embodiment.

Further, though not described in detail, the element array of the sixth embodiment has the same features as those described above in connection with the first, third and fifth embodiments shown in FIGS. 1, 3 and 9 respectively.

Figure 12:
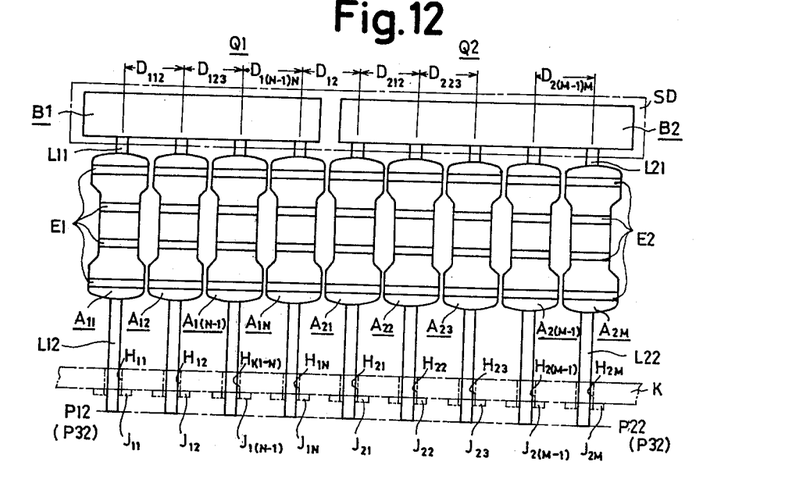
FIG. 12 shows a seventh embodiment of this invention.
Figure 13:
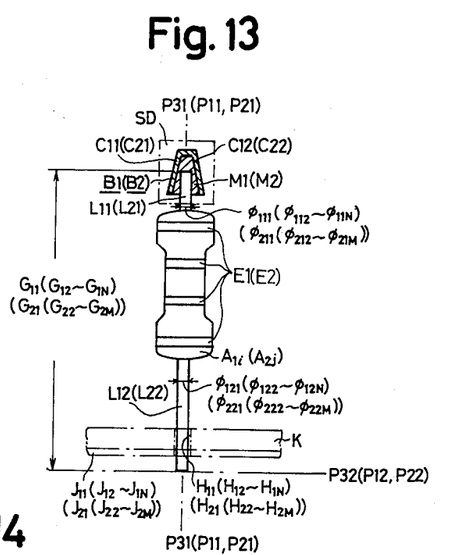
FIG. 13 is a side view, partly in section, of the seventh embodiment shown in FIG. 12.

FIGS. 12 and 13 illustrate a seventh embodiment of the fundamental electric element array of the present invention. In FIGS. 12 and 13 parts corresponding to those in FIG. 7 showing the fourth embodiment are identified by the same reference characters and no detailed description thereof will be repeated. The seventh embodiment is identical in construction with the fourth one except in that in the latter the element array Q1 and Q2 are coupled together through the transparent resinous material S deposited all over the elements $A_{11}$ to $A_{1N}$ and $A_{21}$ to $A_{2M}$ of the element arrays Q1 and Q2, whereas in the former, the element arrays Q1 and Q2 are coupled together through a insulating bar SD of transparent resinous material deposited over the entire length of the conductive bars B1 and B2 of the element arrays Q1 and Q22. In FIG. 13, the lengths of the elements $A_{1i}$ and $A_{2j}$ of the element arrays Q1 and Q2 are indicated by $G_{1i}$ and $G_{2j}$ respectively; the diameters of the wire leads L11 and L12 of the element $A_{1i}$ are indicated by $\Phi_{11i}$ and $\Phi_{12i}$; the diameters of wire leads L21 and L22 of the element $A_{2i}$ are indicated by $\Phi_{21j}$ and $\Phi_{22j}$; the opposing plate members of the conductive bar B1 having connected thereto the element $A_{1i}$ of the element array Q1 are indicated by C11 and C12; and the opposing plate members of the conductive bar B2 having connected thereto the element $A_{2j}$ of the element array Q2 are indicated by C21 and C22.

The above is the seventh embodiment of this invention, and since this embodiment is identical in construction with the fourth embodiment described previously with respect to FIG. 7 except the matter referred to above, there can be achieved such excellent features as are obtainable with the fourth embodiment. On top of that, according to the seventh embodiment, the structure that the alignment of the fundamental electrical element arrays Q1 and Q2 can be achieved by such a very simple structure that the conductive bars B1 and B2 of the element arrays Q1 and Q2 and buried in an insulating bar SD formed of a transparent resinous material which is common to the element arrays Q1 and Q2. Therefore, it can be seen through the transparent insulating bar SD that the conductive bar B1 of the element array Q1 has electrically connected thereto the wire leads L11 of its elements $A_{11}$ to $A_{1N}$ and that the conductive bar B2 of the element array Q2 has electrically connected thereto the wire leads L21 of its elements $A_{21}$ to $A_{2M}$.

Accordingly, the seventh embodiment exhibits such a remarkable advantage that it can be easily learned both before and after mounting the element array on the printed-circuit board K as described above that the element array constitutes such electric aircuits as shown in FIG. 8.

Figure 14:
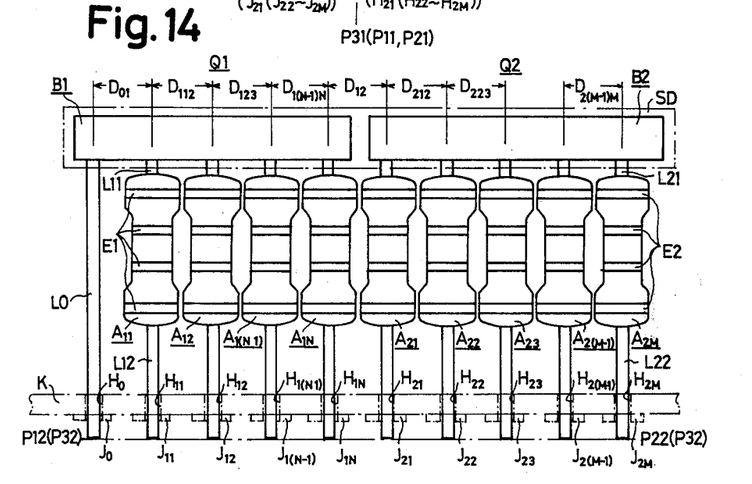
FIGS. 14 and 15 illustrate eighth and ninth embodiments of this invention.
Figure 15:
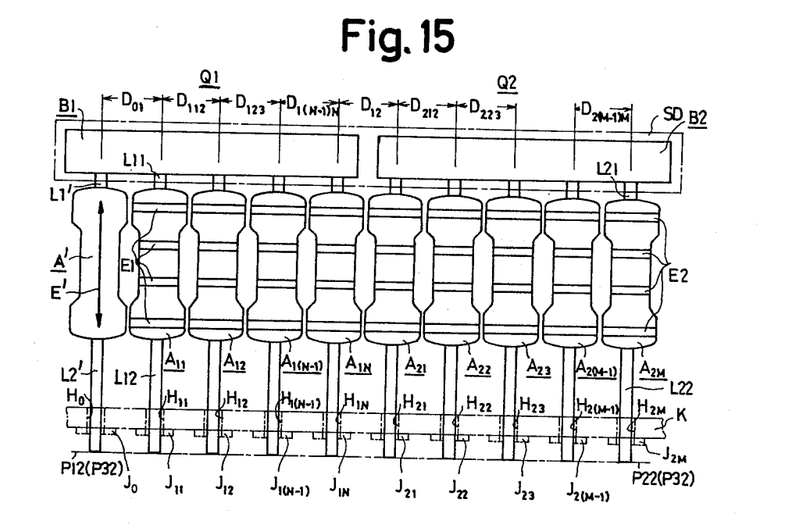

FIGS. 14 and 15 respectively illustrate eighth and ninth embodiments of the fundamental electric element array of the present invention. In FIGS. 14 and 15 parts corresponding to those in FIGS. 9 and 11 showing the fifth and sixth embodiments are identified by the same reference characters and no detailed description thereof will be repeated. The eighth and ninth embodiments are each identical in construction with the fifth and sixth ones except in that in the latter the element arrays Q1 and Q2 are coupled together through the transparent resinous material S deposited all over the elements $A_{11}$ to $A_{1N}$ and $A_{21}$ to $A_{2M}$ of the element arrays Q1 and Q2, whereas in the former, the element arrays Q1 and Q2 are coupled together through a insulating bar SD of a transparent resinous material deposited over the entire length of the conductive bars B1 and B2 of the element arrays Q1 and Q22 as is the case with FIGS. 9 and 11.

The above embodiments are eighth and ninth ones of this invention, and since these embodiments are identical in construction with the fifth and sixth embodiments described previously with respect to FIGS. 9 and 11 except the matter referred to above, there can be achieved such excellent features as are obtainable with the fifth and sixth embodiments and such a feature that it can easily be learned that the element arrays of the eighth and ninth embodiment have the electric circuit shown in FIG. 10 as is the case with the seventh embodiment.

Figure 16:
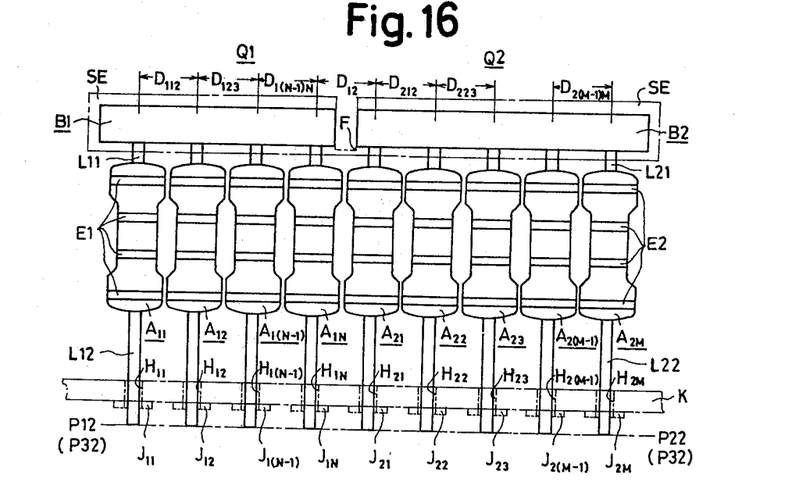
FIGS. 16, 17 and 18 show tenth, eleventh and twelfth embodiments of this invention.
Figure 17:
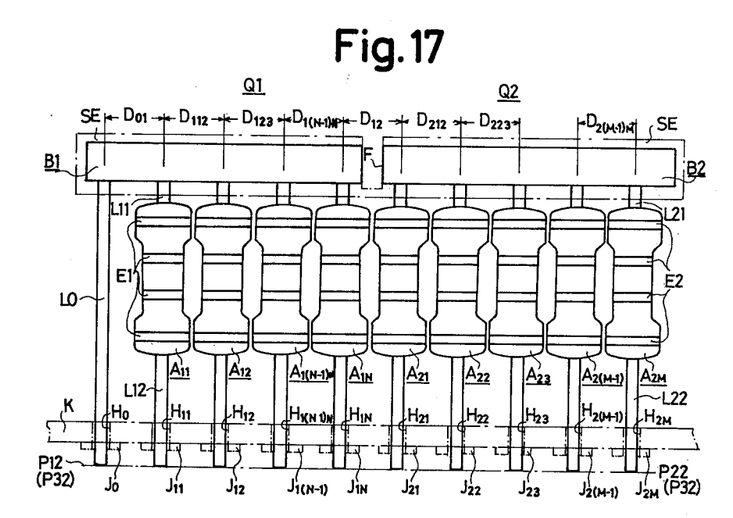
Figure 18:
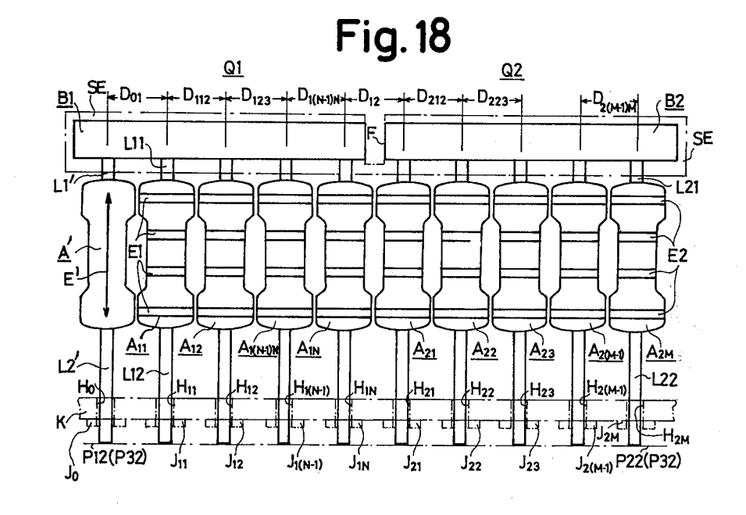

FIGS. 16, 17 and 18 show tenth, eleventh and twelfth embodiments of this invention respectively. In FIGS. 16, 17 and 18, parts corresponding to those in FIGS. 12, 14 and 15 respectively showing the seventh, eighth and ninth embodiments are identified by the same reference numerals and no detailed description thereof will be repeated. These embodiments are identical with those of FIGS. 12, 14 and 15 except in that the insulating bar SD made of a transparent resinous material and coupling together the conductive bars B1 and B2 of the element arrays Q1 and Q2 is replaced with an insulating bar SE which may be formed of an opaque resinous material and in that a recess F is formed in the insulating bar SE at a position midway between the conductive bars B1 and B2.

The above is the tenth, eleventh and twelfth embodiments of the present invention, and since these embodiments are identical in construction with the seventh, eighth and ninth embodiments except the abovesaid matter, they have the same advantages as those of the latter. Further, since the insulating bar SE has the recess F, it can easily be recognized that the element arrays of these embodiments respectively form the electric circuits of FIGS. 8, 10 and 10, even if the insulating bar SE is formed of an opaque material.

It will be apparent that many modifications and variations may be effected without departing from the scope of the novel concepts of this invention.

What is claimed is:

1. A fundamental electrical element array comprising:
    a plurality of columnar, fundamental electrical elements, each provided with wire leads extending from its both ends concentrically therewith;
    at least one lead wire; and
    a conductive bar common to the plurality of fundamental electrical elements and the lead wire;
    wherein the plurality of fundamental electrical elements and the leads wire are electrically and mechanically connected at one wire end to said conductive bar at predetermined intervals in the lengthwise direction of the conductive bar so that they lie side by side in a common plane.

2. A fundamental electrical element array comprising:
    a plurality of columnar, fundamental electrical elements, each provided with wire leads extending from its both ends concentrically therewith;
    at least one columnar, short-circuiting element having wire leads extending from its both ends concentrically therewith; and
    a conductive bar common to the plurality of fundamental electrical elements and the short-circuiting element;
    wherein the plurality of fundamental electrical elements and the short-circuiting element are electrically and mechanically connected at one wire lead to said conductive bar at predetermined intervals in the lengthwise direction of the conductive bar so that they lie side by side in a common plane.

3. A fundamental electrical element array according to claims 1 or 2, wherein the conductive bar is covered with an insulating material.

4. A fundamental electrical element array according to claims 1 or 2, wherein the plurality of fundamental electrical elements each have on the outer surface thereof an indication of its characteristic.

5. A fundamental electrical element array according to claims 1 or 2, wherein the short-circuiting element has on its outer surface an indication of the short-circuiting element.

6. A fundamental electrical element array according to claims 1 or 2, wherein the fundamental electrical elements are resistors.

7. A fundamental electrical element array according to claims 1 or 2, wherein the conductive bar includes a pair of opposing plate members and said one wire leads of the fundamental electrical elements extend between said pair of opposing plate members.

8. A fundamental electrical element array according to claims 1 or 2, wherein said conductive bar includes an inverted V-shaped cross section.

9. A fundamental electrical element array according to claims 1 or 2 wherein the plurality of fundamental electrical elements each have on the outer surface thereof an indication of its kind.

* * * * *